US008542437B1

(12) United States Patent
Lebby et al.

(10) Patent No.: US 8,542,437 B1
(45) Date of Patent: Sep. 24, 2013

(54) EARTH ABUNDANT PHOTONIC STRUCTURES

(75) Inventors: Michael S. Lebby, Palo Alto, CA (US);
Andrew Clark, Palo Alto, CA (US); F. Erdem Arkun, Palo Alto, CA (US);
Robin Smith, Palo Alto, CA (US);
David Williams, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 342 days.

(21) Appl. No.: 12/932,979

(22) Filed: Mar. 9, 2011

Related U.S. Application Data

(60) Provisional application No. 61/312,061, filed on Mar. 9, 2010.

(51) Int. Cl.
*H01S 5/30* (2006.01)

(52) U.S. Cl.
CPC .......... *H01S 5/3031* (2013.01); *H01S 2301/17* (2013.01)
USPC ........................................................ 359/344

(58) Field of Classification Search
CPC ..... H01S 5/3031; H01S 5/3036; H01S 5/304; H01S 5/3045
USPC ........................................................ 359/344
See application file for complete search history.

(56) References Cited

U.S. PATENT DOCUMENTS

| 4,771,010 | A | * | 9/1988 | Epler et al. .................... 438/36 |
| 4,834,501 | A |   | 5/1989 | Honda |
| 5,455,429 | A | * | 10/1995 | Paoli et al. .................... 257/20 |
| 5,548,128 | A |   | 8/1996 | Soref |
| 5,798,537 | A | * | 8/1998 | Nitta .............................. 257/103 |
| 6,154,475 | A | * | 11/2000 | Soref et al. ................. 372/45.011 |
| 6,567,209 | B2 | * | 5/2003 | Lipson et al. ................... 359/346 |
| 6,632,694 | B2 | * | 10/2003 | Torvik ............................ 438/22 |
| 6,734,453 | B2 | * | 5/2004 | Atanackovic et al. .......... 257/19 |
| 6,747,794 | B2 | * | 6/2004 | Wang ............................ 359/344 |
| 6,858,864 | B2 |   | 2/2005 | Atanackovic |
| 6,943,385 | B2 |   | 9/2005 | Usuda |
| 7,023,011 | B2 | * | 4/2006 | Atanackovic et al. .......... 257/22 |
| 7,135,699 | B1 | * | 11/2006 | Atanackovic .................. 257/22 |
| 7,184,203 | B2 |   | 2/2007 | Burgener |
| 7,199,451 | B2 |   | 4/2007 | Kelman |
| 7,254,151 | B2 | * | 8/2007 | Lieber et al. ............... 372/44.01 |
| 7,351,993 | B2 |   | 4/2008 | Atanackovic |
| 7,384,481 | B2 |   | 6/2008 | Atanackovic |
| 7,416,959 | B2 |   | 8/2008 | Atanakovic |
| 7,446,348 | B2 | * | 11/2008 | Yamamoto et al. ........... 257/102 |
| 7,579,623 | B2 |   | 8/2009 | Atanackovic |
| 7,589,003 | B2 |   | 9/2009 | Kouvetakis |
| 7,598,513 | B2 |   | 10/2009 | Kouvetakis |
| 7,643,526 | B1 |   | 1/2010 | Lebby |
| 7,645,517 | B2 | * | 1/2010 | Atanackovic ................. 428/446 |
| 7,655,327 | B2 |   | 2/2010 | Atanackovic |

(Continued)

OTHER PUBLICATIONS

Richter, H., et al.;"Analysis of ytterbium arsenide films grown on GaAs by molecular beam epitaxy"; App.Phy.Lett., 53, 2, 99, (Jul. 11, 1988).

(Continued)

*Primary Examiner* — Mark Hellner
*Assistant Examiner* — Ari M Diacou
(74) *Attorney, Agent, or Firm* — Fernandez & Associates, LLP

(57) ABSTRACT

The present invention relates to semiconductor devices comprising rare earth based optical gain medium layers suitable for electronic and optoelectronic applications.

6 Claims, 14 Drawing Sheets

(56) References Cited

U.S. PATENT DOCUMENTS

| | | | |
|---|---|---|---|
| 2003/0118064 A1* | 6/2003 | Zhao et al. | 372/39 |
| 2004/0056243 A1* | 3/2004 | Atanackovic et al. | 257/19 |
| 2006/0023764 A1* | 2/2006 | Sai | 372/46.01 |
| 2006/0037529 A1 | 2/2006 | D'Evelyn | |
| 2007/0020891 A1 | 1/2007 | Kouvetakis | |
| 2007/0152234 A1* | 7/2007 | Yamamoto et al. | 257/103 |
| 2008/0080573 A1* | 4/2008 | Kawaguchi et al. | 372/26 |
| 2008/0187768 A1 | 8/2008 | Kouvetakis | |
| 2008/0223438 A1 | 9/2008 | Xiang | |
| 2008/0241519 A1 | 10/2008 | Schroeder | |
| 2008/0277647 A1 | 11/2008 | Kouvetakis | |
| 2009/0183774 A1 | 7/2009 | Atanackovic | |
| 2009/0196631 A1* | 8/2009 | Daghighian et al. | 398/201 |
| 2009/0227440 A1 | 9/2009 | Weber | |
| 2009/0229661 A1 | 9/2009 | Mortenson | |
| 2009/0242019 A1 | 10/2009 | Ramamoorthy | |
| 2010/0032687 A1 | 2/2010 | Calder | |
| 2010/0091358 A1* | 4/2010 | Kimerling et al. | 359/344 |
| 2010/0213477 A1* | 8/2010 | Xu et al. | 257/94 |

OTHER PUBLICATIONS

Chang, J., et al.;"Effects of silicon nanostructure evolution on Er3+ luminescence in silicon-rich silicon oxide/Er-doped silica multilayers"; App.Phy.Letters, 89, 181909, (2006).

Choi, H., et al.;"Growth rate limiting by Er(TMOD)3 supply in MOMBE growth of ErSiO crystalline"; IEEE 2007; WP14, 1-4244-0935-7/07/.

Isshiki, H., et al.; "Towards epitaxial growth of ErSiO nanostructured crystalline films on Si substrates"; Optical Materials, 28, (2006), 855.

Isshiki, H., et al.; "Demonstratration of ErSiO superlattice crystal waveguide toward optical amplifiers and emitters"; phys. stat. sol.(a) 205, 1, 52, 2008.

Isshiki, H., et al.; "Semiconducting nature of ErSiO crystalline compounds with superlattice structure"; IEEE 2005; P9, 0-7803-9070-9/05.

Isshiki, H., et al.; "A novel Light Source Material for Silicon Photonics"; MRS-J, 18, 2, May 2006.

Isshiki, H., et al.; "Upconversion emission from ErSiO Superlattice crystal waveguide"; IEEE 2006; P8, 1-4244-0096-1/06.

Isshiki, H., et al.; "Toward Small size waveguide amplifiers based on Erbium Silicate for Silicon photonics"; IEICE Trans. Electron, E91-C, 2, Feb. 2008.

Kimura, T., et al.; "Study on crystalline properties of Er—Si—O compounds in relation to Er-related 1.54 um photoluminescence and electrical properties"; Jl. Luminescence, 121 (2006) 226.

Liu, J., et al.; "Tensile-strained, n-type Ge as a gain medium for monolithic laser integration on Si"; Optics Express, Sep. 3, 2007/vol. 15, No. 18, 11272.

Qi, J., et al.; "Europium silicate thin films on Si substrates fabricated by a radio-frequency sputtering method"; J. Phys. D; Appl. Phys. 33 (2000) 2074.

Sands, T., et al.; "Stable and epitaxial metal/III-V semiconductor heterostructures"; North-Holland 1990.

Schaevitz, R., et al.; "Material Properties of Si—Ge/Ge Quantum Wells"; IEEE Jl. Selected Topics in Quantum Electronics 14, 4, Jul./Aug. 2008.

Suh, K., et al.;"Large-scale fabrication of single-phase Er2SiO5 nanocrystals aggregates using Si nanowires"; App. Phy.Lett., 89, 223102, (2006).

Zhao, D., et al.;"Full-color Mesophase Silicate Thin Film Phosphors Incorporated with rare Earth Ions and Photosensitiers"; Advanced Materials 2007, 19 3473.

Gong, Y., et al.;"Linewidth narrowing and Purcell enhancement in photonic crystal cavities on an Er-doped silicon nitride platform"; Optics Express, Feb. 1, 2010, 18, 3, 2601.

* cited by examiner

RBS Spectra of a Silicate Layer Grown on Silicon

Light emitter, laser structure with emission wavelength of 980, 550nm

PL of $(Gd_{1-x}Nd_x)_2O_3$ @ 900nm

PL of $(Gd_{1-x}Tb_x)_2O_3$ @ 550nm

Tb concentration vs PL intensity

Light emitter, laser structure with emission wavelength of 1550nm

Schematic band structure of bulk Ge.

US 8,542,437 B1

EARTH ABUNDANT PHOTONIC STRUCTURES

PRIORITY

This application claims priority from U.S. Provisional application 61/312,061 filed on Mar. 9, 2010.

Applications and patent Ser. Nos. 11/025,693, 11/393,629, 11/559,690, 11/599,691, 11/635,895, 11/682,078, 11/788, 153, 11/828,964, 11/858,838, 11/873,387 11/960,418, 11/961,938,623 12/029,443, 12/046,139, 12/111,568, 12/119,387, 12/171,200, 12/331,288, 12/408,297, 12/510, 977, 12/619,549, 12/619,621, 12/619,637, 12/651,419, 12/890,537, 13/020,766, 61/312,061, U.S. Pat. No. 6,734, 453, U.S. Pat. No. 6,858,864, U.S. Pat. No. 7,018,484, U.S. Pat. No. 7,023,011 U.S. Pat. No. 7,037,806, U.S. Pat. No. 7,135,699, U.S. Pat. No. 7,199,015, U.S. Pat. No. 7,211,821, U.S. Pat. No. 7,217,636, U.S. Pat. No. 7,253,080, U.S. Pat. No. 7,273,657, U.S. Pat. No. 7,323,396, U.S. Pat. No. 7,351, 993, U.S. Pat. No. 7,355,269, U.S. Pat. No. 7,364,974, U.S. Pat. No. 7,365,357, U.S. Pat. No. 7,384,481, U.S. Pat. No. 7,388,230, U.S. Pat. No. 7,416,959, U.S. Pat. No. 7,432,569, U.S. Pat. No. 7,476,600, U.S. Pat. No. 7,498,229, U.S. Pat. No. 7,579,623, U.S. Pat. No. 7,586,177, U.S. Pat. No. 7,605, 531, U.S. Pat. No. 7,643,526, U.S. Pat. No. 7,645,517, U.S. Pat. No. 7,655,327; all held by the same assignee, contain information relevant to the instant invention and are included herein in their entirety by reference. References, noted in the specification and Information Disclosure Statement, are included herein in their entirety by reference.

BACKGROUND OF THE INVENTION

1. Field of the Invention

The invention relates generally to a semiconductor based photonic structure for radiation emitting and/or amplification devices comprising various combinations of rare-earths, rare-earth oxides, nitrides, phosphides and Group IV semiconductors and combinations thereof.

2. Description of Related Art

Prior art is found in U.S. 2010/032687 and other references cited below. Calder teaches a host matrix, preferably a dielectric, containing rare earth luminescent centers, e.g. rare earth doped alumina, including dielectrics of the general formula $Si_aAl_bO_cN_d$ wherein the rare earth luminescent centers have a preferred doping level of 5% or less. U.S. Pat. No. 7,643,526, held by the same assignee as the instant invention and sharing a common inventor, discloses a structure comprising a microcavity, µ-cavity, and an erbium based active region; however there is no suggestion of a rare earth silicate based gain medium.

As used herein a rare earth, [RE1, RE2, . . . REn], is chosen from the lanthanide series of rare earths from the periodic table of elements {$^{57}$La, $^{58}$Ce, $^{59}$Pr, $^{60}$Nd, $^{61}$Pm, $^{62}$Sm, $^{63}$Eu, $^{64}$Gd, $^{65}$Tb, $^{66}$Dy, $^{67}$Ho, $^{68}$Er, $^{69}$Tm, $^{70}$Yb and $^{71}$Lu} plus yttrium, $^{39}$Y, and scandium, $^{21}$Sc, are included as well for the invention disclosed. "REO" is used generically to refer to rare earth oxide, rare earth nitride, rare earth phosphide and mixtures thereof; "RE" may refer to one or more than one rare earth in combination. "Rare earth silicate" as used herein refers to stoichiometric rare earth silicate compositions as well as non-stoichiometric compounds as well as mixtures of rare earth oxides, phosphides and nitrides and silicates and stoichiometric and non-stoichiometric rare earth silicate compositions.

SUMMARY OF THE INVENTION

Invention of an earth abundant photonic structure comprising an active layer comprising gain medium is disclosed. Such a structure enables optical devices on group IV substrates (e.g. Silicon). One embodiment is an optical amplifier operating in the 1.55 µm band of the electromagnetic spectrum which is well suited for telecommunications applications. This approach in principle benefits from the well established manufacturing techniques of the silicon IC and PV industries. Earth abundant materials include rare earth (RE) oxides, nitrides, phosphides and combinations with group IV and group V elements, e.g. silicates and pnictides. Pnictides, or the nitrogen group, are found in the periodic table group consisting of nitrogen (N), phosphorus (P), arsenic (As), antimony (Sb), bismuth (Bi) and ununpentium (Uup) (unconfirmed). This group has the defining characteristic that all the component elements have electrons in their outermost shell, that is 2 electrons in the s subshell and 3 unpaired electrons in the p subshell.

In some embodiments disclosed structures are epitaxial and of high crystalline quality for high performance optical devices; in some embodiments disclosed structures are not epitaxial and of poly-crystalline, nano-crystalline, quantum dot, amorphous or other combinations; various deposition techniques may be used including CVD, PECVD, MBE, MOCVD, MOMBE, sputtering, sol-gel, e-beam, and others known to one knowledgeable in the art. In some embodiments an active layer comprises a gain medium comprising a rare earth silicate of stoichiometric composition; in some embodiments an active layer comprises a gain medium comprising a rare earth silicate of non-stoichiometric composition; in some embodiments an active layer comprises a gain medium comprising a rare earth silicate and a mixture of one or more of rare earth oxides, nitrides, phosphides, silicon oxides, silicon nitrides and silicon oxynitrides.

Rare earth based layers are of a composition defined by $[RE1]_x[RE2]_y[RE3]_z[IV1]_m\ [IV2]_n[J1]_u[J2]_v[J3]_w$ wherein $0<x$, $u \leq 7$ and $0 \leq m$, n, v, w, y, $z \leq 7$ and J is one of oxygen, nitrogen or phosphorus; IV is one or more Group IV elements and combinations thereof. Group IV based layers are of a composition defined by $Si_uGe_vC_wSn_xPb_y$ wherein at least one of u or v is greater than zero and $0 \leq w$, x, y, (v or u)$\leq 5$; optionally, a Group IV based layer may comprise oxygen and/or nitrogen. Rare earth base layers and Group IV based layers may be single crystal, polycrystalline, microcrystalline, nano crystals, quantum dots or amorphous. In some embodiments rare earth based layers and/or Group IV based layers form an interleaved structure; in some embodiments there is no interleaving; in some embodiments only rare earth layers are present; in some embodiments only Group IV based layers are present; in some embodiments an interleaved structure may be a DBR, distributed Bragg reflector. In some embodiments an interleaved structure may be an optical gain medium.

The present invention relates to semiconductor devices suitable for electronic, photonic, and optoelectronic applications. In a particular form, the present invention relates to the fabrication of a photonic device through the use and/or combination of crystalline, quantum dot or amorphous semiconductors, insulators, rare-earth based compounds and substrates.

DETAILED DESCRIPTION OF THE INVENTION

The instant invention discloses a structure to achieve optical gain of incident radiation in some embodiments; optionally, a structure may also be an emitter and provide amplification at selected wave lengths based upon a predetermined rare earth based gain medium composition comprising rare earth silicate compound(s). In some embodiments a disclosed structure acts as an optical gain medium when biased and is operable to amplify optical emission at 1550 nm; in some embodiments an optical gain medium comprises a Group IV layer and a REO layer; in some embodiments a plurality of interleaved Group IV layers and REO layers are operable as an optical gain medium. In some embodiments comprising Ge or Ge/Si layers Ge is under stress such that the direct band gap transition is available for optical processes.

Figure 1:
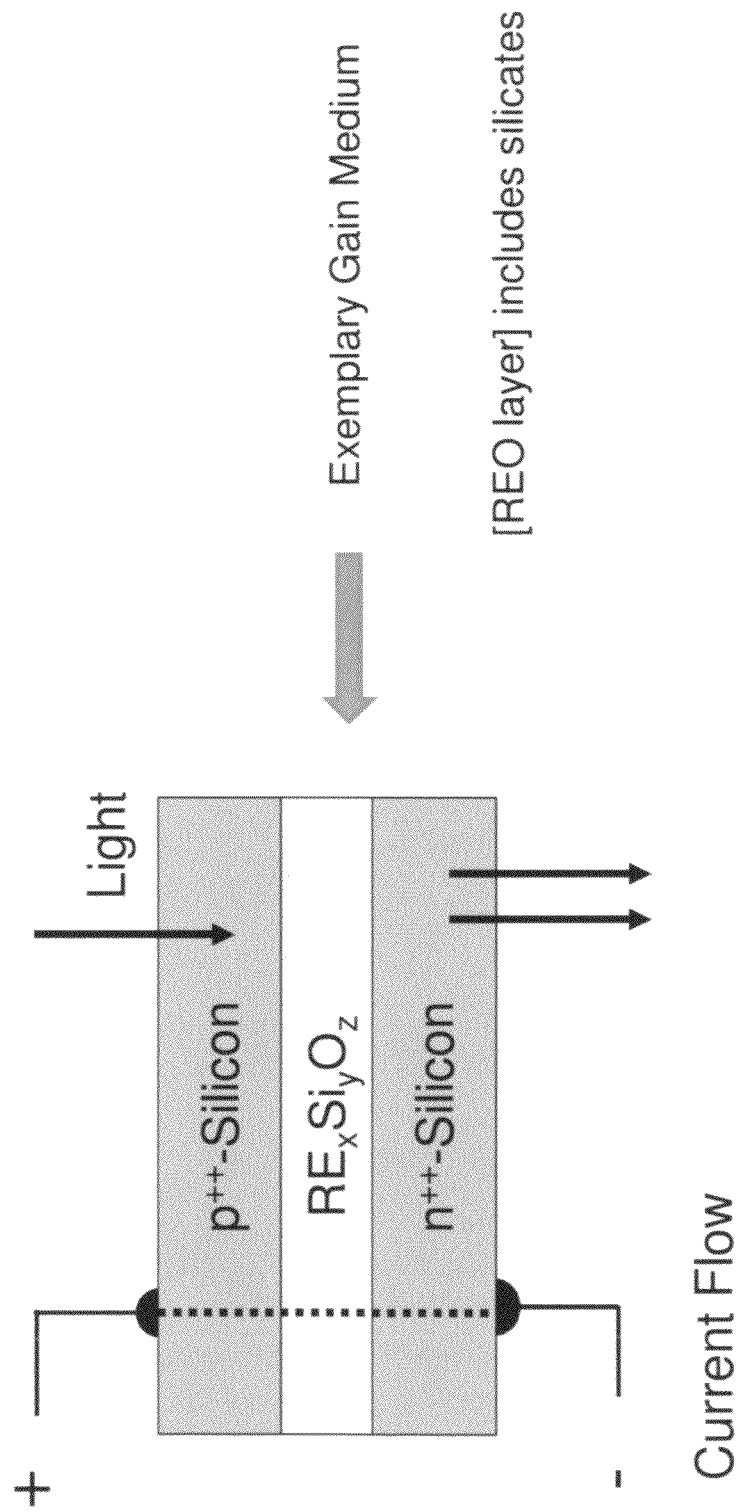
FIG. 1 shows an exemplary structure for light amplification with rare earth silicates.

FIG. 1 shows one embodiment of an optical gain medium when biased; the exemplary structure is capable of amplifying optical emission at 1.55 µm or other wavelengths depending on the rare earth(s) compounds chosen. In some embodiments $RE_xSi_yO_z$ may be a stoichiometric compound such as $Y_2SiO_5$; optionally $Y_2Si_2O_7$; optionally a rare earth compound of the type $(Gd_{1-x}Tb_x)_2O_3$ in combination with a silicate. In some embodiments a structure to achieve optical gain comprises an optical gain medium with one or more rare earth based pnictide layers on one or both sides; optionally, a structure to achieve optical gain may comprise a distributed Bragg reflector.

Figure 2:
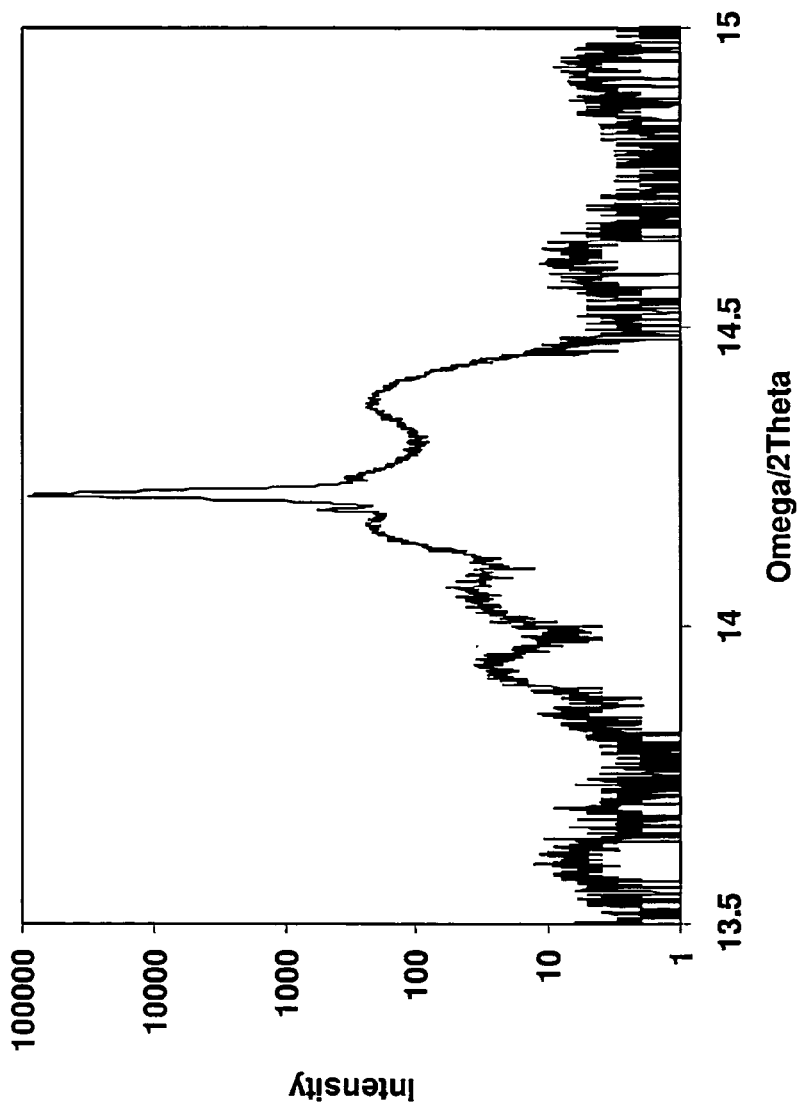
FIG. 2 is an exemplary x-ray diffraction spectra of a $Re_xSi_yO_z$ layer on silicon.
Figure 3:
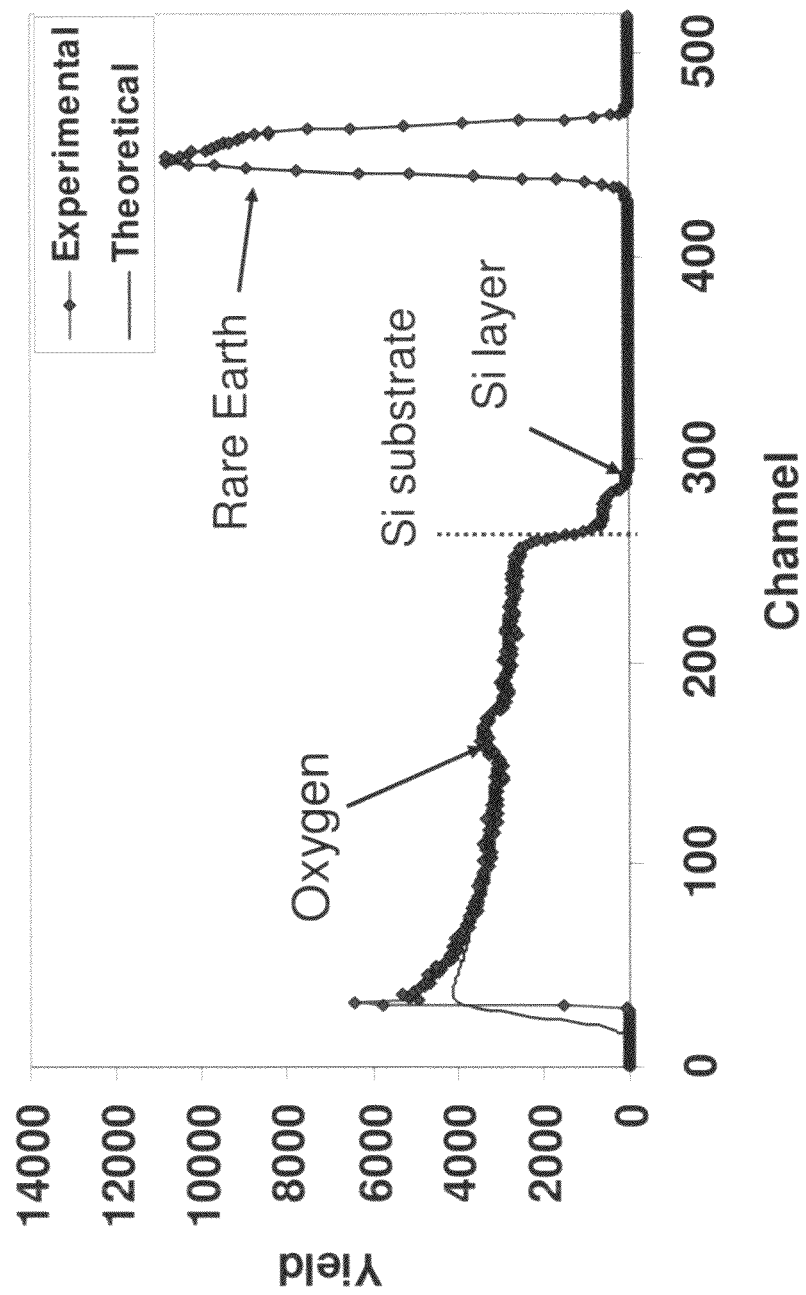
FIG. 3 is an exemplary Rutherford Backscatter spectra of a $Re_xSi_yO_z$ layer on silicon.
Figure 4:
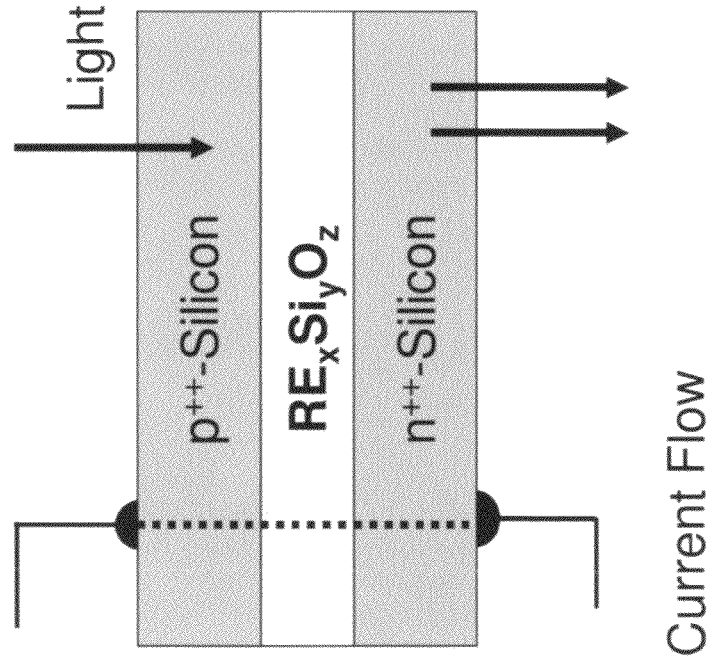
FIG. 4 shows exemplary structure for light amplification with rare earth silicates at 550 nm and 980 nm.
Figure 12:
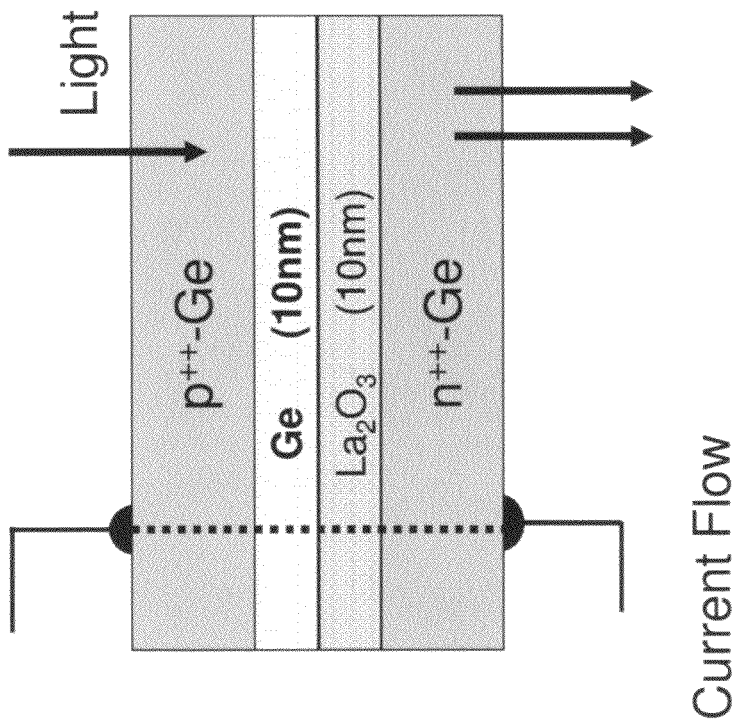
FIG. 12 is an exemplary light emitter structure on Ge with emission at 1550 nm.

FIG. 2 shows an x-ray diffraction spectra of an exemplary $RE_xSi_yO_z$ compound layer on a silicon substrate. FIG. 3a shows an RBS spectra of the $RE_xSi_yO_z$ compound layer on a silicon substrate. Particle Induced X-ray Emission, PIXE, spectra of the $RE_xSi_yO_z$ layer confirms a composition by weight of 20.3% RE, 23.8 Si %. FIG. 12 shows one embodiment of a germanium based structure to achieve light emission, a laser structure with emission wavelength of 1550 nm; consisting of Ge/REO layers to function as an optical gain medium; optionally, multiple Ge/REO layers may be interleaved.

Figure 13A:
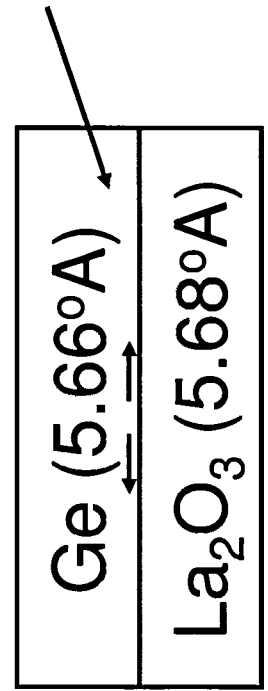
FIG. 13a shows tensile strain in Ge layer on REO layer.
Figure 13B:
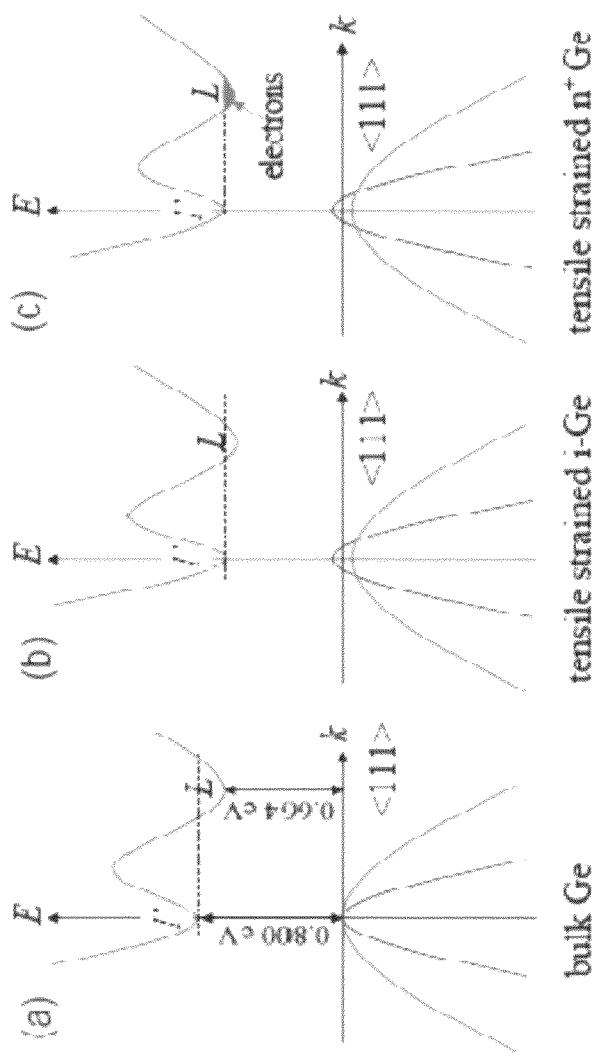
FIG. 13b shows indirect and direct band gap for Ge.

FIGS. 13a and 13b show how light emission may be achieved with tensile strained germanium in conjunction with a REO layer of suitable structure. Liu, J., et al.; "Tensile-strained, n-type Ge as a gain medium for monolithic laser integration on Si"; Optics Express, 3 Sep. 2007/Vol. 15, No. 18, 11272 describe the straining phenomena; Liu does not suggest the use of REO compounds to achieve straining. Ge is strained (tension) when grown on a layer of $La_2O_3$. The difference between the direct and indirect bandgap of germanium is only 136 meV. The direct bandgap of Ge is 0.8 eV corresponding to 1550 nm. Introducing tensile strain into Ge decreases the energy difference between the direct (F) and indirect (L) conduction band valleys. The rest of the difference is made up by doping Ge n-type. This will in turn enable light emission at 1550 nm from Ge which is in the telecommunications C-band. FIG. 13b shows a schematic band structure.

Figures 5A, 5B, 5C:
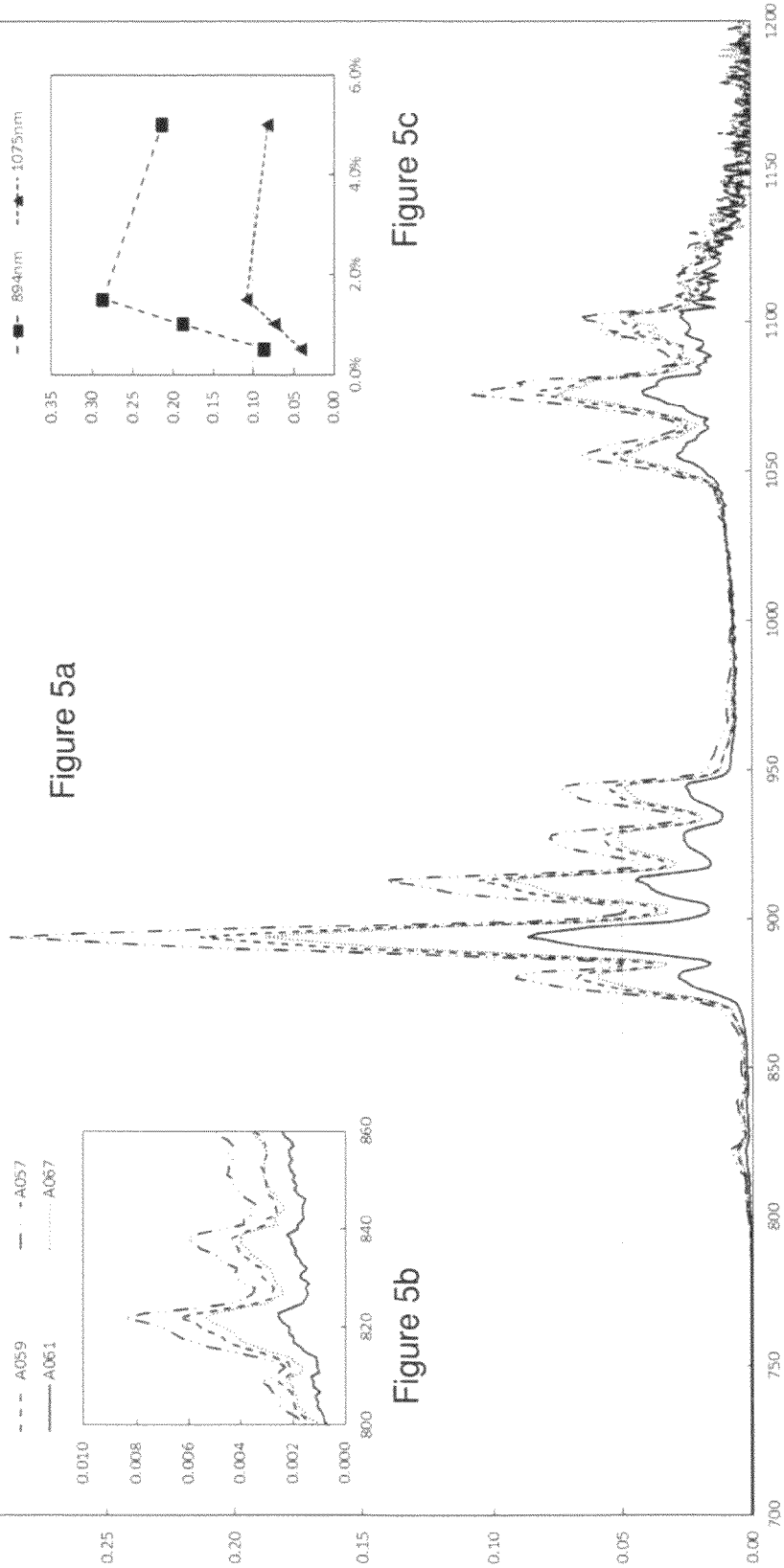
FIGS. 5a, b and c show exemplary photoluminescence for light amplification with rare earth silicates and varying Nd content.
Figure 6:
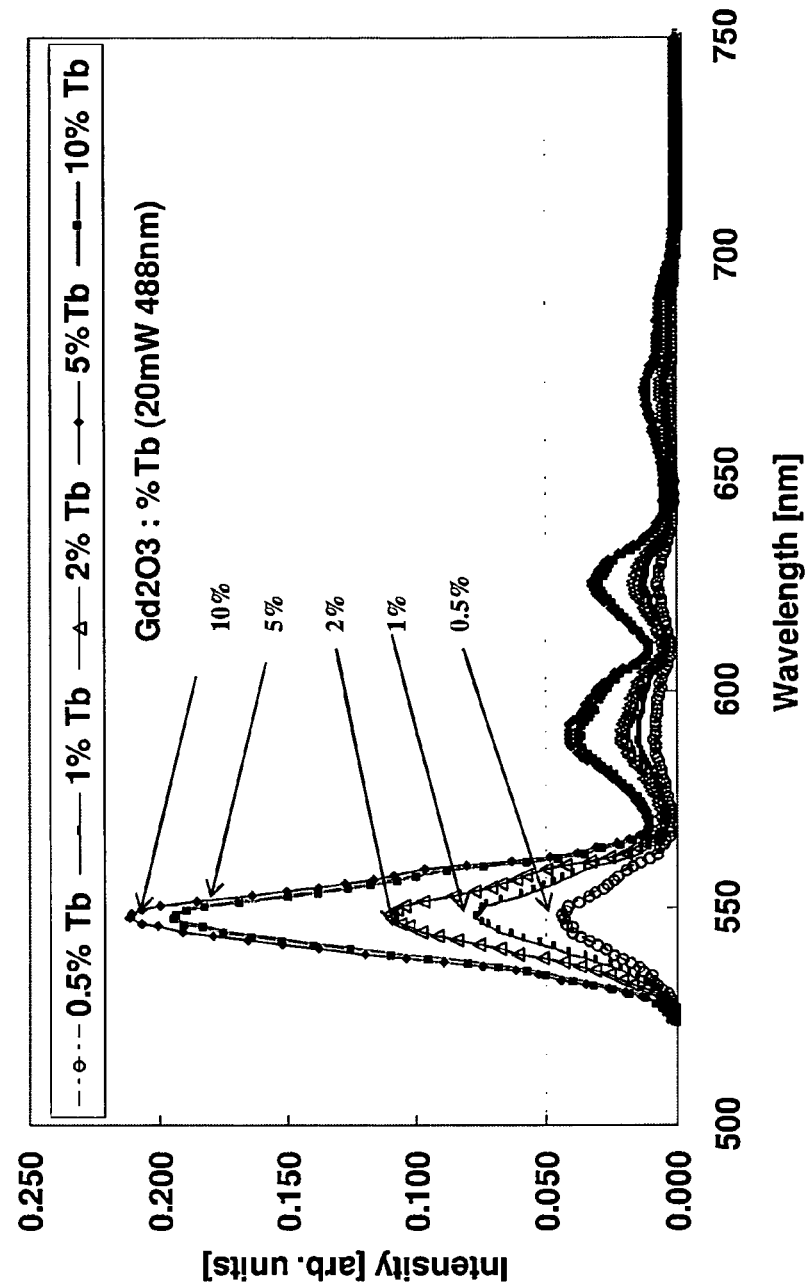
FIG. 6 shows exemplary photoluminescence for light amplification with rare earth silicates and varying Tb content.
Figure 7:
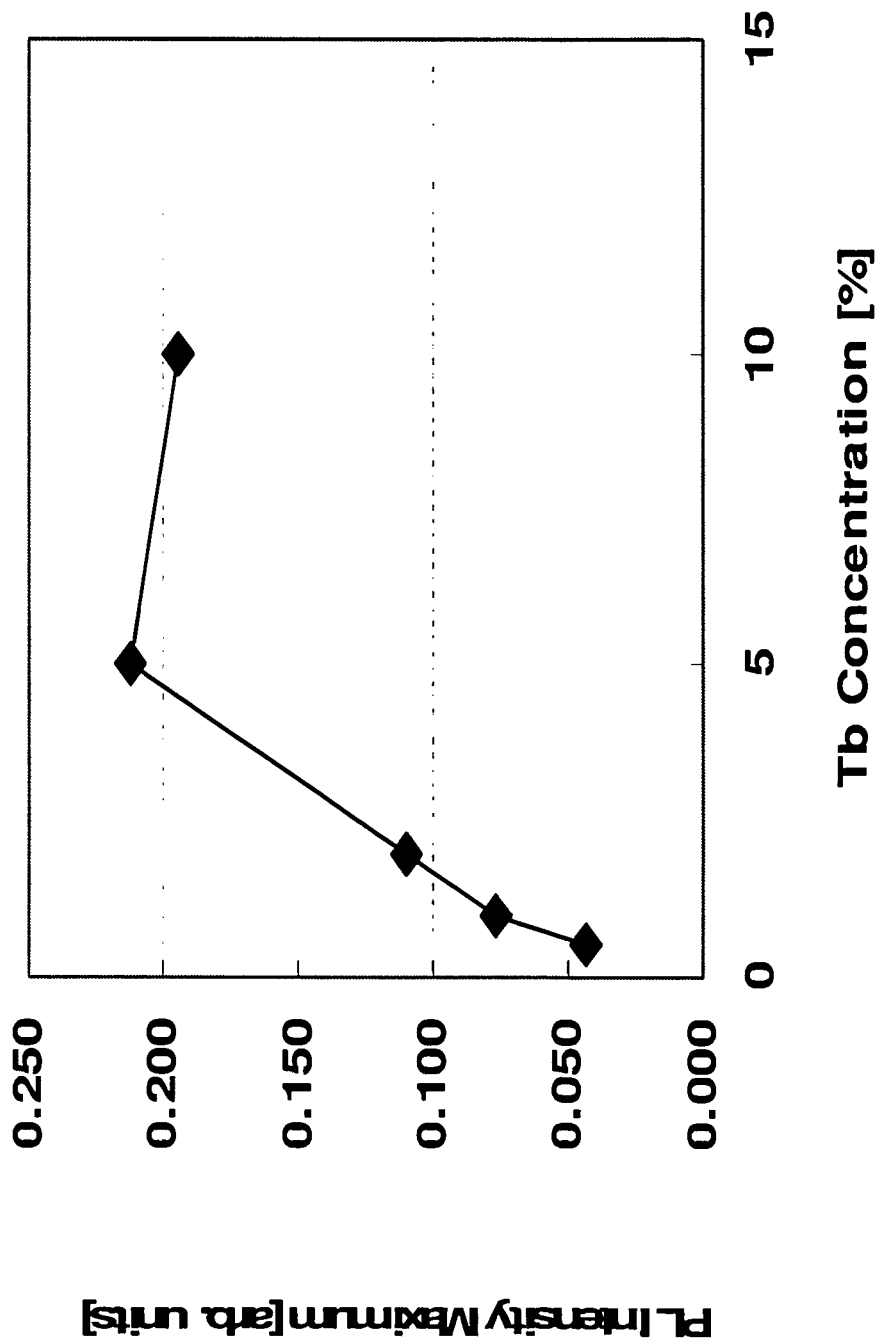
FIG. 7 shows exemplary photoluminescence versus Tb content.

FIG. 5a shows relative photoluminescence intensity, PL, versus Nd content for a $(Gd_{1-x}Nd_x)_2O_3$ compound. FIG. 5b shows the detail about 800-860 nm versus Nd content; FIG. 5c shows PL variation at 894 nm and 1075 nm versus Nd content. In some embodiments optical properties of rare earths may be tuned without using silicates, as noted in FIG. 11. FIG. 6 shows an exemplary structure based on $RE_xSi_yO_z$ comprising Tb and/or Yb for emission at 550 nm and/or 980 nm, e.g. $(Gd_{1-x}Tb_x)_2O_3$. Choice of rare earth element, $Re_x$, determines wavelength of emission, e.g. Tb at 550 nm or Yb at 980 nm. FIG. 7 shows relative photoluminescence intensity, PL, versus Tb content for a $(Gd_{1-x}Tb_x)_2O_3$ compound.

Figure 8:
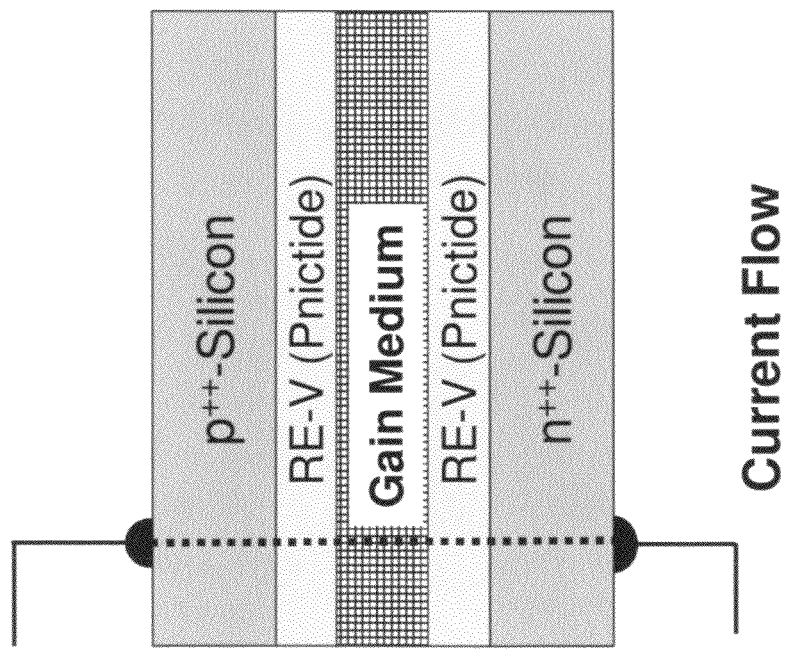
FIG. 8 shows exemplary structure for light amplification with rare earth silicates and pnictide based layers.

In some embodiments, as shown in FIG. 8, a rare earth optical gain medium is in contact with rare earth based pnictide layers. In some embodiments an optical gain medium comprises a silicate layer. FIG. 8 discloses use of pnictide, semi-metallic layers lattice matched to semiconductor contact layers, optionally, silicon; RE-pnictide layers act as current spreading layers for active optical gain medium layers, optionally, $RE_xSi_yO_z$ layers.

A rare earth based pnictide layer is one comprising at least one rare earth, RE, and at least one element from the nitrogen group of the periodic table, designated as V; described by: $[RE1_aV1_b]_c[RE2_dV2_e]_f$, wherein a, b, c>0 and 0≤d, e, f≤5.

Figure 9:
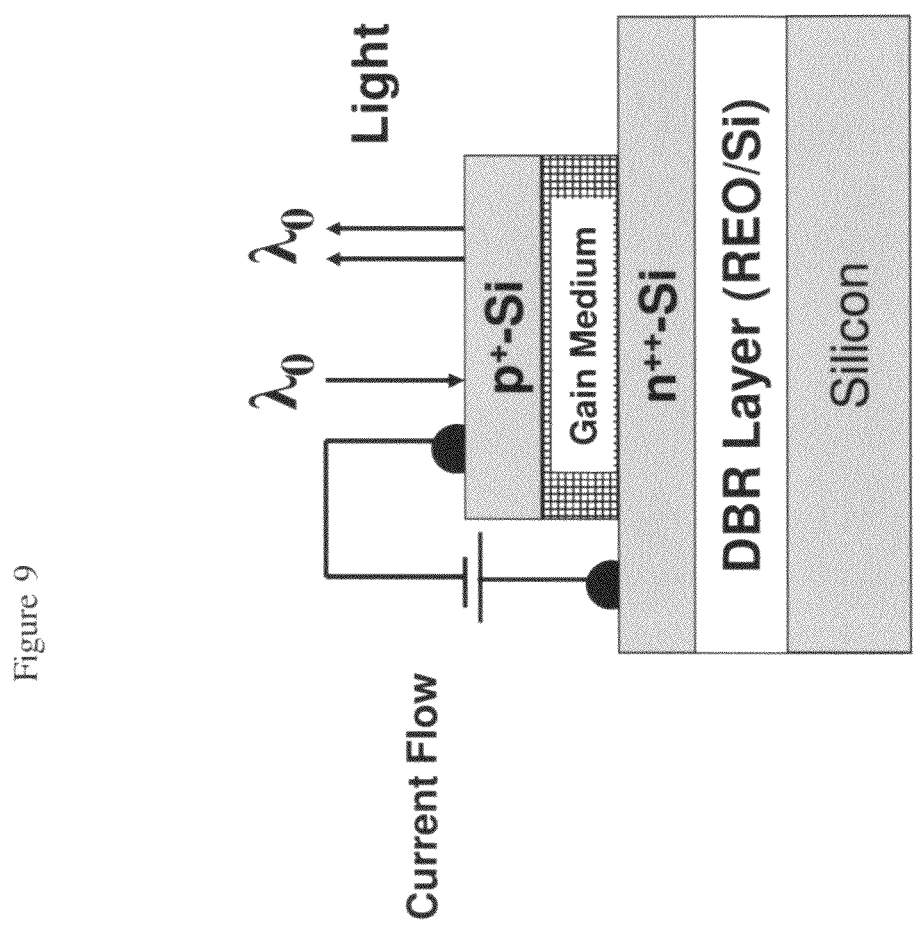
FIG. 9 shows exemplary structure for light amplification and a REO based DBR.

FIG. 9 shows an exemplary embodiment of a structure to achieve optical gain of incident radiation comprising a rare earth compound based distributed Bragg reflector, DBR, wherein a higher intensity of light at nominal wavelength $\lambda_0$ is reflected back out of the structure than is incident thereon. In some embodiments a DBR layer is formed by stacking REO/Si multilayers for multiple periods; a DBR is tuned for reflecting at $\lambda_0$ light in this particular example. Use of DBR layer and, optional, pnictide contact enhancement layers can be used together or separately in various embodiments.

Figure 10B:
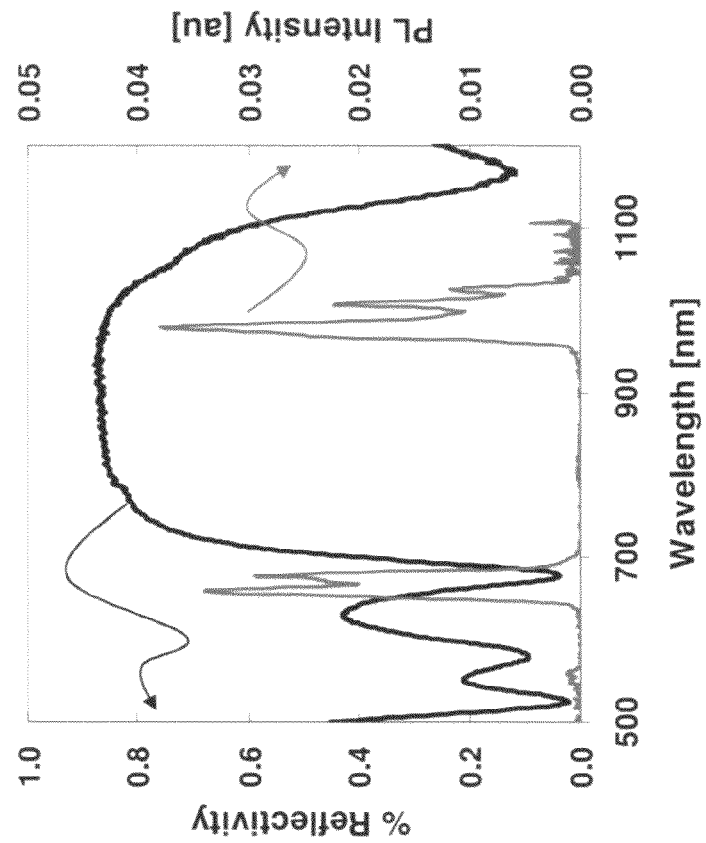
FIG. 10a shows a TEM of an exemplary a distributed Bragg reflector and FIG. 10b is a plot of reflectivity and PL intensity versus wavelength.
Figure 10A:
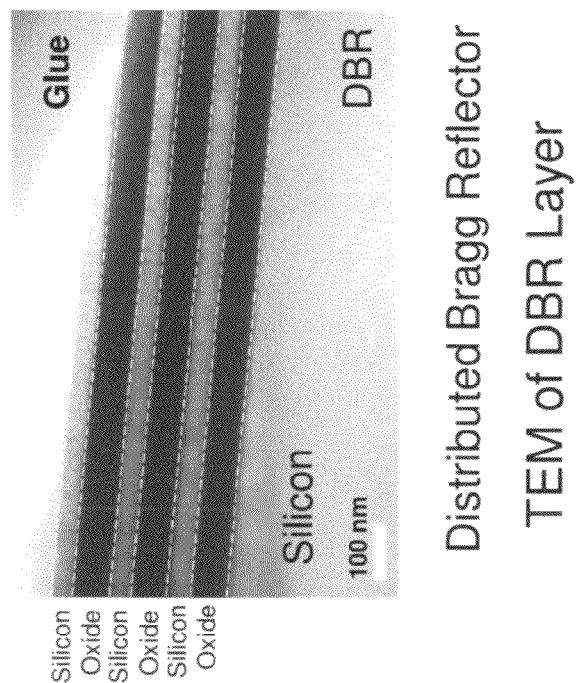
Figure 11:
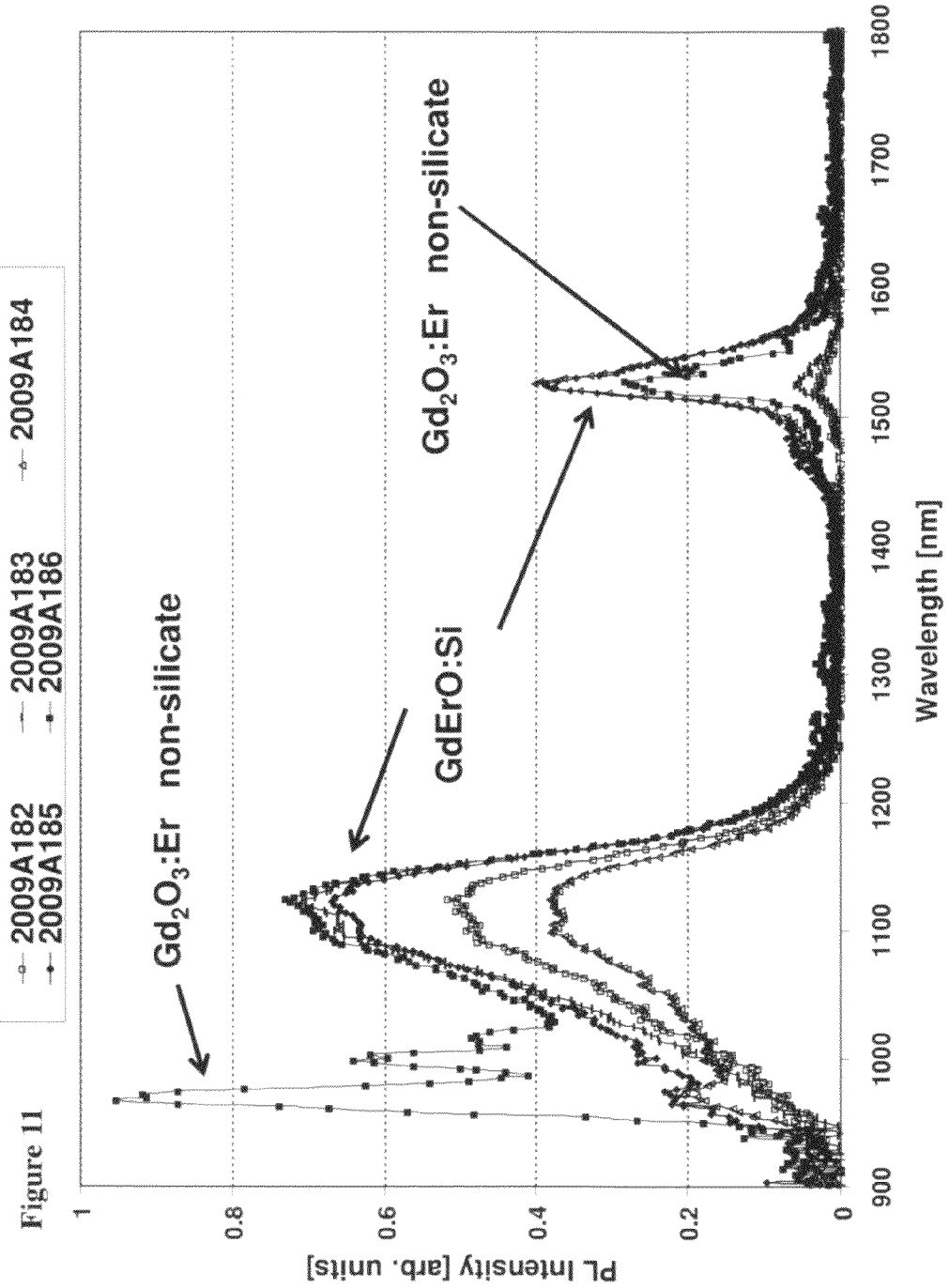
FIG. 11 shows PL intensity versus wavelength for different gain medium compositions.

FIG. 10a is a transmission electron micrograph of a DBR structure with several Si/REO layers. FIG. 10b shows the reflectivity spectra of the DBR. The refractive index contrast of rare-earth materials with silicon enables a DBR with greater than 90% peak reflectivity and a stop band greater than 150 nm. In some embodiments a rare earth based material may be functioning as a distributed Bragg reflector, DBR. By setting the thickness of the rare earth oxide according to a formula $$nd = m\lambda/4 \qquad (1)$$

where n=refractive index at λ, d=layer thickness and λ=wavelength at which the optical characteristics of the layer are specified and m is an odd integer; optionally, the same layer can be considered to be an anti-reflective coating. FIG. 11 shows exemplary gain medium of rare earths in a host matrix with and without silicates; 2009A186 is the PL of a non-silicate sample.

In some embodiments a rare earth oxide and a silicon layer have a thickness also conforming to Eqn. (1). The combination of multiple repeats of these two layers is nominally termed a Distributed Bragg Reflector (DBR) and may be designed to be an anti-reflective layer over an expanded range when compared to a single layer approach. In this example a silicon layer within the DBR is, optionally, doped electrically to conform to the chosen device architecture; optionally, a RE-pnictide layer acts as a current spreading layer.

In some embodiments a structure within a solid state device comprises a rare earth layer operable as an optically active medium; optionally an optically active medium comprises more than 15 mole percent rare earth; optionally an optically active medium comprises more than 25 mole percent rare earth; optionally an optically active medium comprises more than 35 mole percent rare earth; optionally an optically active medium comprises more than 50 mole percent rare earth; optionally an optically active medium comprises more than 70 mole percent rare earth; optionally the balance of an optically active medium is silicon and oxygen; optionally the balance of an optically active medium is a Group IV element and oxygen. In some embodiments an optically active medium is a rare earth silicate of stoichiometric composition. In some embodiments an optically active medium is a rare earth alumino-silicate comprising one or more rare earths, silicon, aluminum and oxygen and, optionally, nitrogen. In some embodiments an optically active medium layer has one or more layers and is in contact with its upper and/or lower surface comprising one or more rare earths and at least one pnictide element chosen from a group consisting of nitrogen, phosphorus, arsenic, antimony and bismuth.

In some embodiments an active medium may be a germanium layer in tensile strain, optionally heavily doped, such that a direct band gap optical transition may occur; in some embodiments one or more rare earth based compounds is operable to enable the tensile strain in a germanium based active medium layer; in some embodiments a germanium layer may be a silicon/germanium alloy.

In some embodiments a structure within a solid state device comprises a first region of first composition, a second region of second composition and a third region of third composition separated from the first region by the second region; wherein the second region comprises a first and second rare-earth compound such that the lattice spacing of the first compound is different from the lattice spacing of the second compound and the third composition is different from the first composition; optionally, a solid state device comprises a first and third region comprising substantially elements only from Group IV; optionally, a solid state device comprises a fourth region comprising substantially elements only from Groups III and V; optionally, a solid state device comprises a fourth region comprising substantially elements only from Groups II and VI. Optionally, a solid state device comprises a second region described by $[RE1]_x[RE2]_y[RE3]_z[X]_m[Y]_n[J1]_u[J2]_v[J3]_w$ wherein $0<x$, $u\leq 7$ and $0\leq m$, n, v, w, y, $z\leq 7$ and J is one of oxygen, nitrogen or phosphorus; X and Y are different Group IV elements and combinations thereof; optionally, a solid state device comprises a second region comprising a first portion of fourth composition adjacent said first region; a second portion of fifth composition; and a third portion of sixth composition separated from the first portion by the second portion and adjacent said third region wherein the fifth composition is different from the fourth and sixth compositions; optionally, a solid state device comprises a second portion comprising a first surface adjacent said first portion and a second surface adjacent said third portion and said fifth composition varies from the first surface to the second surface; optionally a solid state device comprises a second portion comprising a first surface adjacent said first portion and a second surface adjacent said third portion and comprises a structure comprising two layers of different composition which, optionally, repeat at least once; optionally a solid state device comprises a first portion in a first state of stress and a third portion in a second state of stress different from the first state of stress.

In some embodiments a solid state device comprises first and second semiconductor layers separated by a rare earth layer wherein the first semiconductor layer is of composition $X_{(1-m)}Y_m$; the second semiconductor layer is of composition $X_nY_oZ_p$ and the rare earth layer is of a composition described by $[RE1]_x[RE2]_y[RE3]_z[IV1]_a[IV2]_b[J1]_u[J2]_v[J3]_w$ wherein $0<x$, $u\leq 7$ and $0\leq a$, b, v, w, y, $z\leq 7$ wherein [RE] is chosen from a rare earth; [J1], [J2] and [J3] are chosen from a group consisting of Oxygen (O), Nitrogen (N), and Phosphorus (P); and X, Y and Z are chosen from Group IV elements, and combinations thereof, such that $0\leq m\leq 1$, $0\leq o$, $p\leq 1$, and $0<n$; optionally, a device comprises a rare earth layer comprising a first and second rare earth layer such that the composition of the first layer is different from the composition of the second layer and the lattice spacing of the first layer is different from the lattice spacing of the second layer. In some embodiments an optical gain medium layer comprises more than one layer; optionally, a gain medium layer comprises a silicate layer such that $0<a$, x, $u\leq 7$.

In some embodiments a solid state device comprises a first semiconductor layer; a second semiconductor layer; and a rare earth layer comprising regions of different composition separating the first semiconductor layer from the second semiconductor layer; wherein the rare earth layer is of a composition described by $[RE1]_x[RE2]_y[RE3]_z[IV1]_a[IV2]_b[J1]_u[J2]_v[J3]_w$ wherein $0<x$, $u\leq 7$ and $0\leq a$, b, v, w, y, $z\leq 7$ and J is one of oxygen, nitrogen or phosphorus; IV is one or more Group IV elements and combinations thereof. such that the composition of the rare earth layer adjacent the first semiconductor layer is different from the composition of the rare earth layer adjacent the second semiconductor layer; optionally, a device comprises first and second semiconductor materials chosen from one or more Group IV elements or alloys; optionally, a device comprises a rare earth layer comprising a first region adjacent said first semiconductor layer, a second region adjacent said second semiconductor layer and a third region separating the first region from the second region such that the composition of the third region is different from the first region and the second region.

In some embodiments an earth abundant photonic structure comprising a gain medium comprises a first layer, optionally a rare earth pnictide layer, with a first surface; a gain medium including rare earth silicate material positioned on the first surface of the first layer; and a second layer, optionally a rare earth pnictide layer, with a second surface, the second layer being positioned on the gain medium; optionally the gain medium comprises more than one layer wherein each layer may be of different rare earth compositions, optionally, silicate, optionally, alumino-silicate, optionally rare earth silicate with non-stoichiometric Group IV material.

In some embodiments an earth abundant photonic structure for providing light emission at a selected wavelength comprising a gain medium comprises a first distributed Bragg reflector; a first layer of silicon dielectric material positioned on the first distributed Bragg reflector, the first layer having a first surface; gain medium including rare earth silicate material positioned on the first surface of the first layer, the gain medium being formed to emit light at a normal wavelength for the rare earth silicate material; and a second layer of silicon dielectric material with a second surface, the second layer being positioned on the gain medium; optionally, the light emission at a selected wavelength from the structure is spontaneous emission; optionally, the structure includes a second distributed Bragg reflector positioned on the second layer; optionally, the selected wavelength of the light emission from the structure is different than the normal wavelength of the active region, and at least the active region and the second layer have thicknesses designed to shift the light emission from the normal wavelength to the selected wavelength; optionally, a solid state device amplifies at least two incident wavelengths of radiation are amplified and the optical gain medium layer consists of one or more REO compounds and one or more Group IV elements; optionally, a Group IV based compound.

It will be understood that when an element as a layer, region or substrate is referred to as being "on" or "over" or "adjacent" another element, it can be directly on the other element or intervening elements may also be present. In contrast, when an element is referred to as being "directly on" or "directly over" or "in contact with" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein a stratum, or, in the plural, strata, is a layer of material, optionally, one of a number of parallel layers one upon another.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit, light emitting device, solar cell, flexible circuit and MEMS technologies. Other variations and embodiments are possible in light of above teachings, and it is thus intended that the scope of invention not be limited by this Detailed Description, but rather by Claims following. All references to published material including patents and applications are included herein in their entirety by reference.

REFERENCES INCORPORATED HEREIN IN THEIR ENTIRETY BY REFERENCE

1. RICHTER, H., et al.; "Analysis of ytterbium arsenide films grown on GaAs by molecular beam epitaxy"; App. Phy. Lett., 53, 2, 99, (11 Jul. 1988)
2. CHANG, J., et al.; "Effects of silicon nanostructure evolution on Er3+ luminescence in silicon-rich silicon oxide/Er-doped silica multilayers"; App. Phy. Letters, 89, 181909, (2006)
3. Choi, H., et al.; "Growth rate limiting by Er(TMOD)3 supply in MOMBE growth of ErSiO crystalline"; IEEE 2007; WP14, 1-4244-0935-7/07/
4. Isshiki, H., et al.; "Towards epitaxial growth of ErSiO nanostructured crystalline films on Si substrates"; Optical Materials, 28, (2006), 855.
5. Isshiki, H., et al.; "Demonstratration of ErSiO superlattice crystal waveguide toward optical amplifiers and emitters"; phys. stat. sol.(a) 205, 1, 52, 2008.
6. Isshiki, H., et al.; "Semiconducting nature of ErSiO crystalline compounds with superlattice structure"; IEEE 2005; P9, 0-7803-9070-9/05
7. Isshiki, H., et al.; "A novel Light Source Material for Silicon Photonics"; MRS-J, 18, 2, May 2006.
8. Isshiki, H., et al.; "Upconversion emission from ErSiO Superlattice crystal waveguide"; IEEE 2006; P8, 1-4244-0096-1/06
9. Isshiki, H., et al.; "Toward Small size waveguide amplifiers based on Erbium Silicate for Silicon photonics"; IEICE Trans. Electron, E91-C, 2, February 2008
10. Kimura, T., et al.; "Study on crystalline properties of Er—Si—O compounds in relation to Er-related 1.54 um photoluminescence and electrical properties"; Jl. Luminescence, 121 (2006) 226.
11. Liu, J., et al.; "Tensile-strained, n-type Ge as a gain medium for monolithic laser integration on Si"; Optics Express, 3 Sep. 2007/Vol. 15, No. 18, 11272.
12. Qi, J., et al.; "Europium silicate thin films on Si substrates fabricated by a radio-frequency sputtering method"; J. Phys. D; Appl. Phys. 33 (2000) 2074.
13. Sands, T., et al.; "Stable and epitaxial metal/III-V semiconductor heterostructures"; North-Holland 1990
14. Schaevitz, R., et al.; "Material Properties of Si—Ge/Ge Quantum Wells"; IEEE Jl. Selected Topics in Quantum Electronics 14, 4, July/August 2008.
15. Suh, K., et al.; "Large-scale fabrication of single-phase Er2SiO5 nanocrystals aggregates using Si nanowires" "; App. Phy. Lett., 89, 223102, (2006)
16. Zhao, D., et al.; "Full-color Mesophase Silicate Thin Film Phosphors Incorporated with rare Earth Ions and Photosensitiers"; Advanced Materials 2007, 19 3473.
17. GONG, Y, et al.; "Linewidth narrowing and Purcell enhancement in photonic crystal cavities on an Er-doped silicon nitride platform"; Optics Express, Feb. 1, 2010, 18, 3, 2601

U.S. Patents and Applications incorporated herein by reference in their entirety:

18. U.S. Pat. No. 6,734,453
19. U.S. Pat. No. 6,858,864
20. U.S. Pat. No. 6,943,385
21. U.S. Pat. No. 7,351,993
22. U.S. Pat. No. 7,384,481
23. U.S. Pat. No. 7,416,959
24. U.S. Pat. No. 7,199,451
25. U.S. Pat. No. 5,548,128
26. U.S. Pat. No. 4,834,501
27. U.S. Pat. No. 7,598,513
28. U.S. Pat. No. 7,589,003
29. U.S. Pat. No. 7,184,203
30. 20090242019
31. 20090183774
32. 20090229661
33. 20080223438
34. 20080241519
35. 20070020891
36. 20080277647
37. 20080187768
38. 20100032687
39. 20090227440
40. 20060037529

We claim:

1. A solid state device for amplifying one or more incident wavelengths of radiation comprising:
   first and second semiconductor layers; and
   an optical gain medium layer separating the first and second semiconductor layers wherein the first semiconductor layer and the second semiconductor layer are of composition $Si_u Ge_v C_w Sn_x Pb_y$ such that at least one of u or v is greater than zero and $0 \leq w, x, y, (v \text{ or } u) \leq 5$; and wherein the solid state device is configured such that at least one wavelength of the incident radiation is at a higher intensity exiting the device than entering the device and wherein the optical gain medium layer is of a composition described by $[RE1]b[RE2]c[Si]a[O]d$ wherein $0<b, a, d\leq 7$ and $0\leq c\leq 7$ wherein [RE] is chosen from a rare earth; is Oxygen (O) and Si is silicon and further comprising first and second current spreading layers wherein the first current spreading layer separates the first semiconductor layer from the optical gain medium layer and the second current spreading layer separates the second semiconductor layer from the optical gain medium layer and wherein the current spreading layers are semi-metallic layers lattice matched to the first and second semiconductor contact layers comprising at least one rare earth, RE, and at least one element from the nitrogen group of the periodic table, designated as V; described by: $[RE1_m V1_n]_o [RE2_p V2_q]_r$, wherein m, n, o>0 and $0 \leq p, q, r \leq 5$.

2. The solid state device of claim 1 is configured such that a second incident wavelength are is amplified.

3. A solid state device for amplifying one or more incident wavelengths of radiation comprising:
   first and second semiconductor layers;
   first and second current spreading layers; and
   an optical gain medium layer between the first and second current spreading layers wherein the first current spreading layer separates the first semiconductor layer from the optical gain medium layer and the second current spreading layer separates the second semiconductor layer from the optical gain medium layer wherein the first semiconductor layer and the second semiconductor layer are of composition $Si_u Ge_v C_w Sn_x Pb_y$ such that at least one of u or v is greater than zero and $0 \leq w, x, y,$ (v or u)$\leq 5$; and the optical gain medium layer comprises a rare earth, silicon and oxygen and the current spreading layers comprise a rare earth and a pnictide wherein at least one wave length of the incident radiation is at a higher intensity exiting the device than entering the device.

4. The solid state device of claim 3 configured such that at least two incident wavelengths of radiation are amplified and the optical gain medium layer consists of one or more REO compounds and one or more Group IV elements.

5. The solid state device of claim 3 wherein the current spreading layers are semi-metallic layers lattice matched to the first and second semiconductor contact layers comprising at least one rare earth, RE, and at least one element from the nitrogen group of the periodic table, designated as V; described by: $[RE1_m V1_n]_o [RE2_p V2_q]_r$, wherein m, n, o>0 and $0 \leq p, q, r<5$.

6. The solid state device of claim 3 wherein the optical gain medium layer has a composition described by $[RE1]b[RE2]c[Si]a[O]d$ wherein $0<b, a, d\leq 7$ and $0\leq c\leq 7$ wherein [RE] is chosen from a rare earth; [O] is Oxygen (O) and Si is silicon.

* * * * *